(12) United States Patent  
Huang

(10) Patent No.: US 7,656,020 B2  
(45) Date of Patent: Feb. 2, 2010

(54) PACKAGING CONDUCTIVE STRUCTURE FOR A SEMICONDUCTOR SUBSTRATE HAVING A METALLIC LAYER

(75) Inventor: Cheng Tang Huang, Tainan County (TW)

(73) Assignee: Chipmos Technologies, Inc., Hsinchu (TW)

( * ) Notice: Subject to any disclaimer, the term of this patent is extended or adjusted under 35 U.S.C. 154(b) by 0 days.

(21) Appl. No.: 11/822,113

(22) Filed: Jul. 2, 2007

(65) Prior Publication Data

US 2008/0197475 A1 Aug. 21, 2008

(30) Foreign Application Priority Data

Feb. 16, 2007 (TW) .............................. 96106246 A

(51) Int. Cl.
*H01L 23/488* (2006.01)
*H01L 23/495* (2006.01)

(52) U.S. Cl. .............................. 257/690; 257/E23.175; 257/E23.146; 257/E23.021; 257/E23.031; 257/E21.538; 257/734; 257/677; 257/E21.495; 257/E21.44; 257/E21.477; 438/121; 438/612

(58) Field of Classification Search ................. 257/734, 257/690, E23.175, E21.538, E23.146, E23.031, 257/E21.508, E21.495, E21.44, E21.477, 257/E23.021, 677; 438/121, 612
See application file for complete search history.

(56) References Cited

U.S. PATENT DOCUMENTS

| | | | | |
|---|---|---|---|---|
| 5,466,637 A | * | 11/1995 | Kim | 438/639 |
| 5,762,259 A | * | 6/1998 | Hubacher et al. | 228/180.22 |
| 6,107,667 A | * | 8/2000 | An et al. | 257/408 |
| 6,590,295 B1 | * | 7/2003 | Liao et al. | 257/781 |
| 6,756,671 B2 | * | 6/2004 | Lee et al. | 257/737 |
| 7,408,181 B2 | * | 8/2008 | Chang | 257/4 |
| 2005/0130388 A1 | * | 6/2005 | Suh | 438/438 |
| 2005/0260794 A1 | * | 11/2005 | Lo et al. | 438/108 |
| 2007/0023925 A1 | * | 2/2007 | Ke et al. | 257/779 |
| 2008/0122078 A1 | * | 5/2008 | He et al. | 257/737 |
| 2008/0169539 A1 | * | 7/2008 | Fang et al. | 257/676 |
| 2008/0182401 A1 | * | 7/2008 | Ke et al. | 438/614 |
| 2008/0265413 A1 | * | 10/2008 | Chou et al. | 257/737 |

* cited by examiner

*Primary Examiner*—Alexander O Williams
(74) *Attorney, Agent, or Firm*—Muncy, Geissler, Olds & Lowe, PLLC

(57) ABSTRACT

A packaging conductive structure for a semiconductor substrate and a method for forming the structure are provided. The dielectric layer of the packaging conductive structure partially overlays the metallic layer of the semiconductor substrate and has a receiving space. The lifting layer and conductive layer are formed in the receiving space, wherein the conductive layer extends for connection to a bump. The lifting layer is partially connected to the dielectric layer. As a result, the conductive layer can be stably deposited on the edge of the dielectric layer for enhancing the reliability of the packaging conductive structure.

11 Claims, 6 Drawing Sheets

PACKAGING CONDUCTIVE STRUCTURE FOR A SEMICONDUCTOR SUBSTRATE HAVING A METALLIC LAYER

This application claims benefits from the priority of Taiwan Patent Application No. 096106246 filed on Feb. 16, 2007; the disclosures of which are incorporated by reference herein in their entirety.

CROSS-REFERENCES TO RELATED APPLICATIONS

Not applicable.

BACKGROUND OF THE INVENTION

1. Field of the Invention

The present invention relates to a packaging conductive structure for a semiconductor substrate. In particular, the invention relates to a packaging conductive structure with a redistribution layer (RDL).

2. Descriptions of the Related Art

Electronic products have been equipped with semiconductor chips to provide control or logic operation functions. With the recent advancement of manufacturing process technologies, semiconductor chips have miniaturized, thereby, gradually reducing the packaging size.

Due to the miniaturization, the conventional wire bonding techniques for connecting semiconductor chips to other devices are no longer applicable. The flip chip bonding technique has replaced the wire bonding technique for connecting the semiconductor chips to other devices using bumps. More specifically, a plurality of bumps electrically connected to the structure inside the chip is disposed on the surface of the semiconductor chip for bonding purposes. In addition, the flip chip bonding technique does not require a large area, as previously required in the conventional wire technique, making it suitable for advanced process.

Furthermore, the conventional package technology further adopts the design of an RDL. Pads are arranged on the exterior of the integrated circuits (ICs). If bumps are directly formed on the pads, the number for the bumps and pitches between bumps may be limited, causing poor bonding and other defects in the bumps. The RDL has an indirect electrical connection with the bumps and the pads. To increase flexibility, the pads are connected to the bumps through a conductive layer, allowing the bumps to rearrange and not be limited to their original positions.

A conventional packaging structure with an RDL is shown in FIG. 1. A semiconductor chip 10 comprises a substrate 11 with a metallic layer 111 disposed thereon. The metallic layer 111, i.e. pad, serves as a contact point between the inner semiconductor structure and the external devices. A dielectric layer 13 disposed on the substrate 11 overlays the periphery of the metallic layer 111. A portion of the metallic layer 111 is exposed from the dielectric layer 111. Then, an RDL 15 with a deposited conductive layer 151 and protection layer 153 is formed. Next, a through-hole is formed in the protection layer 153 where the bump will be formed. An under bump metallization (UBM) 17 is formed in the through-hole. Finally, the bump 19 is formed. Wherein, the UBM 17 is made of multilayer metallic films of titanium, chromium, copper, gold and so on. The UBM 17 provides the electrical connection and improves the adhesion for the bump, thus providing a stable bonding between the bump 19 and the conductive layer 151. The bump 19 may be electrically connected to the metallic layer 111 of the substrate 11 using the above-mentioned structure. In addition, the bump's position can also be adjusted to increase the flexibility of using the semiconductor chip in the flip chip technique.

However, because the deposition of the conductive layer is unidirectional, it is difficult to form a conductive layer with a thick enough side wall in the dielectric layer 13 during the deposition of the conductive layer 151. As a result, the risk of conductive layer breakage is increased. As shown in the dotted-line area of FIG. 1, it is more difficult to deposit a portion of the conductive layer 151 near the side wall of the dielectric layer 13. The conductive layer 151 may break easily if the process is not controlled well, causing the semiconductor chip to fail.

Accordingly, a solution of providing a packaging conductive structure that can ensure the electrical connection in a semiconductor structure with an RDL is highly desired in semiconductor technology.

SUMMARY OF THE INVENTION

The primary objective of this invention is to provide a packaging conductive structure for a semiconductor substrate, especially, a packaging conductive structure with an RDL. By using the extension of the conductive layer, the positions of the bumps may be redistributed to enhance the flexibility of using the semiconductor chip in flip chip techniques.

Another objective of this invention is to provide a packaging conductive structure. The packaging conductive structure has a lifting layer that facilitates the deposition of the conductive layer. Particularly, the lifting layer can improve the deposition on the side wall of the dielectric layer and prevent breakage of the conductive layer, thus, enhancing the packaging reliability on the semiconductor chip.

Yet a further objective of this invention is to provide a packaging conductive structure. The bottom surface of the conductive layer comes into contact and is electrically connected to the metallic layer of the semiconductor substrate. The deposition of the conductive layer facilitated along at least one direction due to the lifting layer. As a result, an electrical connection between the bumps and the conductive layer is ensured.

To achieve the above and other objectives, the present invention provides a packaging conductive structure for a semiconductor substrate with a metallic layer disposed thereon. The packaging conductive structure forms a dielectric layer on the semiconductor substrate to partially overlay the metallic layer and define a receiving space. The packaging conductive structure further comprises a lifting layer and a conductive layer in the receiving space. The lifting layer is partially connected to the dielectric layer, while the conductive layer is electrically connected to the metallic layer of the semiconductor substrate and partially overlaps an edge of the dielectric layer.

The present invention further provides a method for forming the above-mentioned packaging conductive structure. The method comprises the following steps: (a) forming a dielectric layer on the semiconductor substrate and partially overlaying the metallic layer to define a receiving space; (b) forming a lifting layer in the receiving space for partially overlaying the metallic layer and partially connecting it to the dielectric layer; and (c) forming a conductive layer in the receiving space in which the conductive layer is adapted to electrically connect to the metallic layer through the receiving space.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
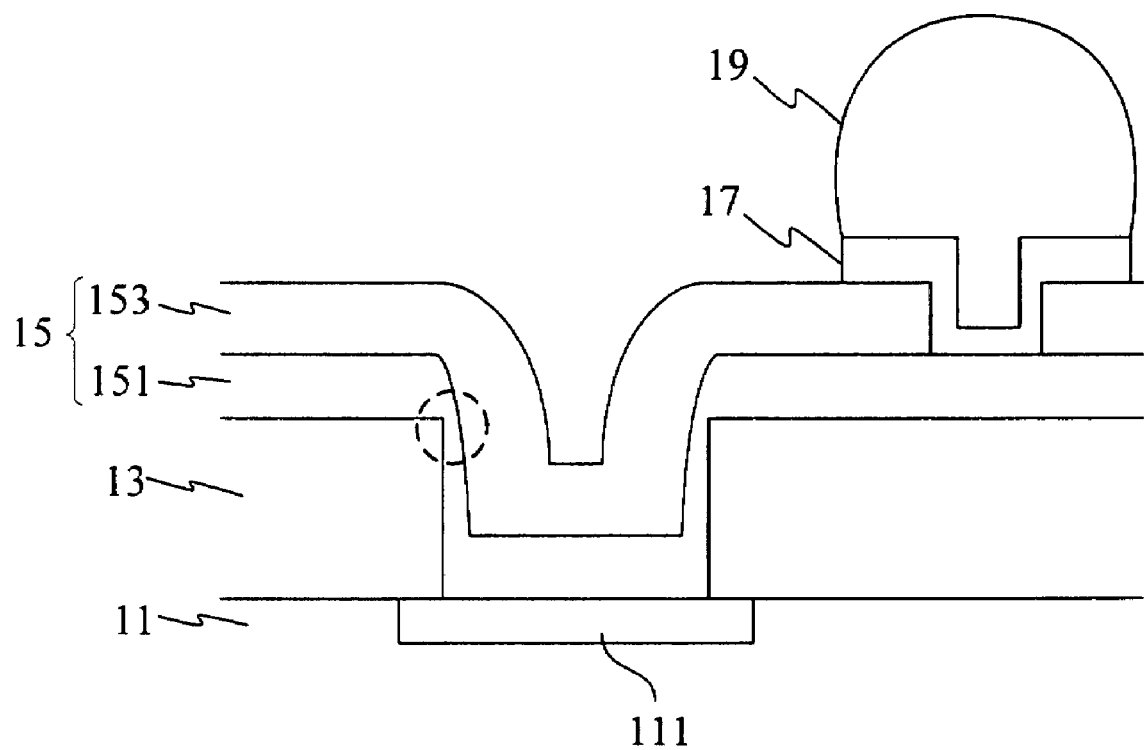
FIG. 1 is a schematic cross-sectional view showing a conventional packaging conductive structure.
Figure 2A:
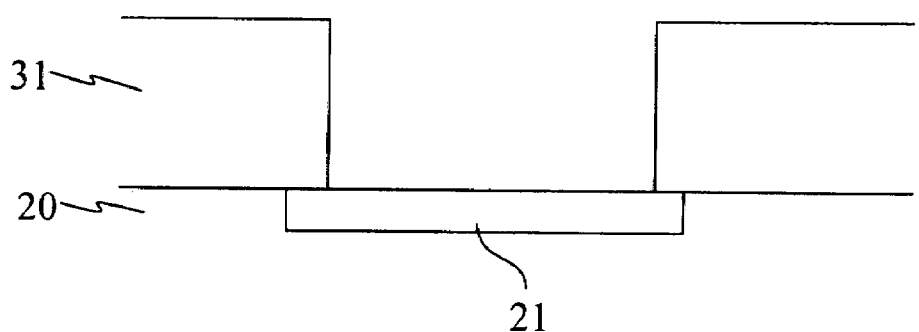
FIG. 2A is a schematic cross-sectional view showing a receiving space formed in the packaging conductive structure of the present invention.

In reference to FIG. 2A, a packaging conductive structure 30 of the present invention is applied to a semiconductor substrate 20. The semiconductor substrate 20 usually has a metallic layer 21, i.e. a pad, which serves as a contact point for electrical connection. Generally, the metallic layer 21 is made of aluminum and may electrically connect to other external devices after combining with the packaging conductive structure 30 of the present invention.

First, a dielectric layer 31 is formed on the semiconductor substrate 20. The dielectric layer 31 partially overlays the metallic layer 21 to define a receiving space, so as to expose a portion of the metallic layer 21. More specifically, a large-area dielectric material may be previously formed with a photoresistance layer (not shown) partially formed thereon. Next, an etching process is performed to remove a portion of the dielectric layer which is not overlaid by the photoresistance layer to form the receiving space.

Figure 2B:
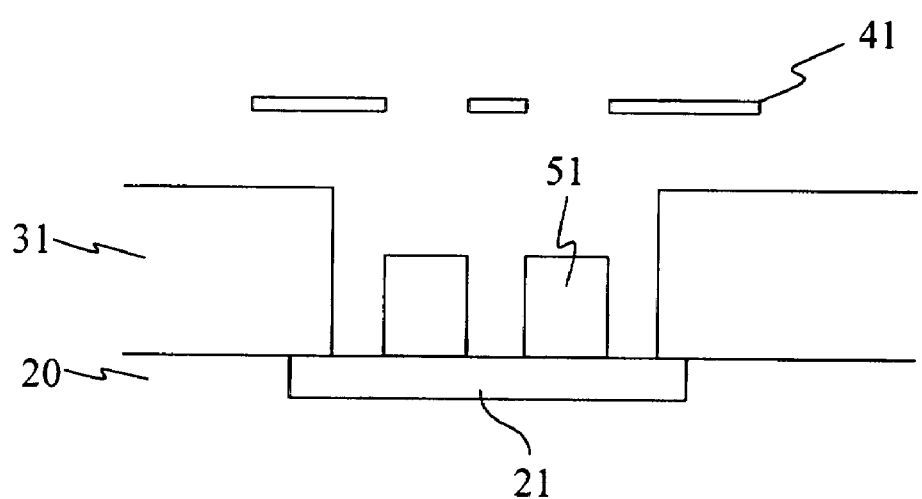
FIG. 2B is a schematic cross-sectional view showing a lifting layer formed in the packaging conductive structure of the present invention.
Figure 2C:
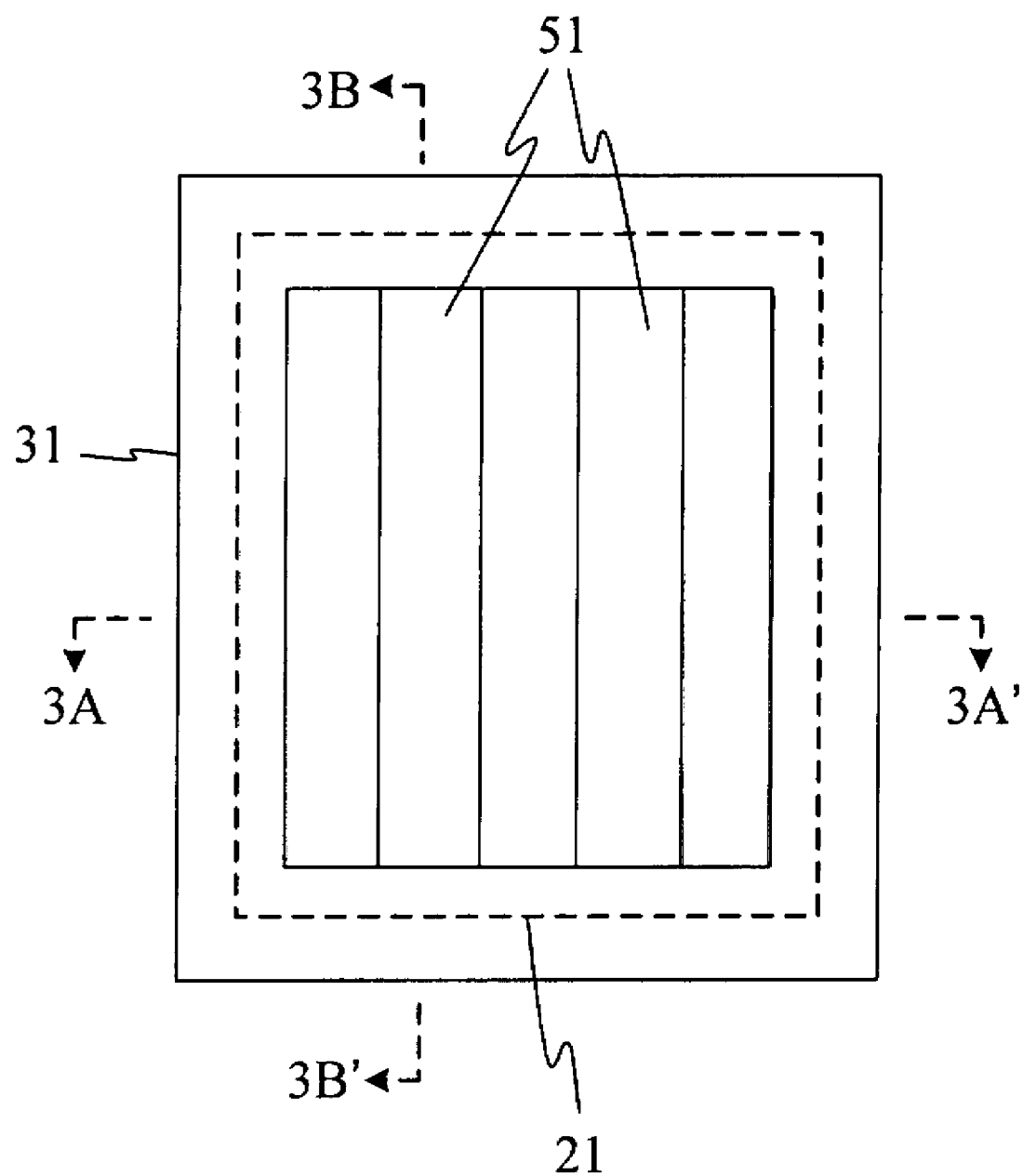
FIG. 2C is a schematic top view showing the packaging conductive structure of the present invention.

Next, in FIG. 2B, a lifting layer 51 is previously formed in the receiving space. The lifting layer 51 can be made of polyimide (PI) or oxide. A photolithography process may be used to form the lifting layer 51, wherein the photoresistance layer is patterned in the receiving space using a mask 41. The top view of the lifting layer 51 is shown in FIG. 2C, which illustrates the relationship of the lifting layer 51 in the receiving space. The present invention is unique in that the lifting layer 51 overlays a portion of the metallic layer 21 and has two opposite ends that are partially connected to the side wall of the dielectric layer 31.

Figure 2D:
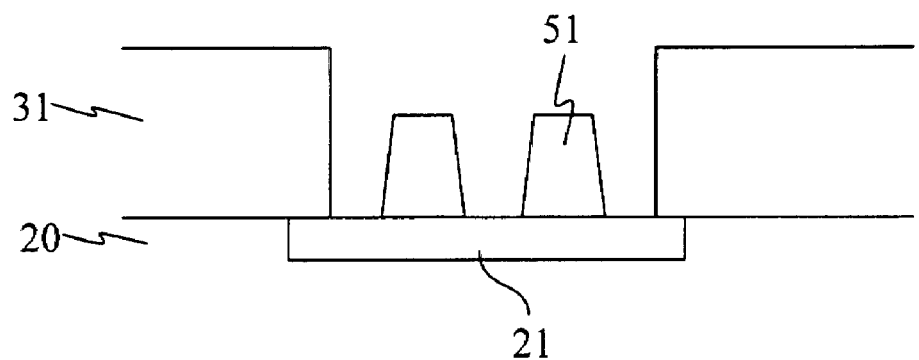
FIG. 2D is a schematic cross-sectional view showing a lifting layer formed in the packaging conductive structure of the present invention.
Figure 2E:
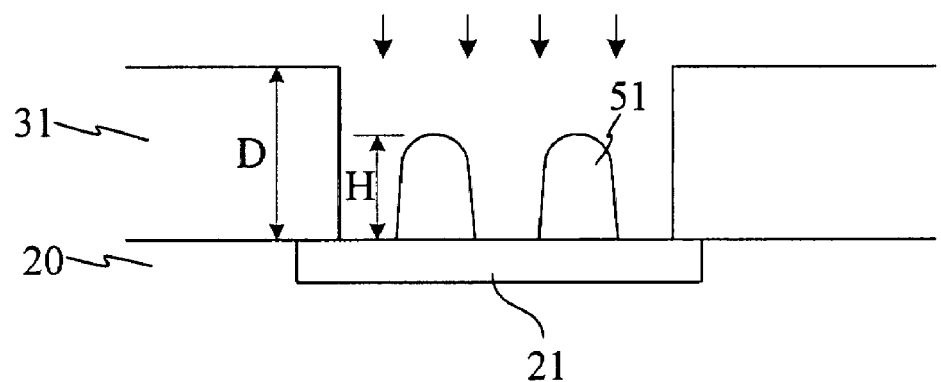
FIG. 2E is a schematic cross-sectional view showing a lifting layer formed in the packaging conductive structure of the present invention.

After the photolithography process, a high-temperature baking process over 300 degrees centigrade (° C.) is performed on the lifting layer 51 for solidification. The structure may shrink slightly to present the trapezoidal-structure cross-sectionally as shown in FIG. 2D. Subsequently, a plasma treatment may be performed for removing the residues in the receiving space as shown in FIG. 2E. The surface of the lifting layer 51 subsequently becomes smoother.

It is noted that the dimension and the number of lifting layers 51 are not limited herein. For example, if the receiving space has a longitudinal dimension D (i.e. the depth of the receiving space) and the lifting layer has a longitudinal dimension H (i.e. the height of the lifting layer 51), the longitudinal dimension H is at least half of the longitudinal dimension D. The longitudinal dimension H can also be substantially equal to the longitudinal dimension D (i.e. the height of the lifting layer 51 is equal to the depth of the receiving space). Any lifting layer 51 with dimension that fall within this range can still achieve the desire effect of the present invention.

Figure 3A:
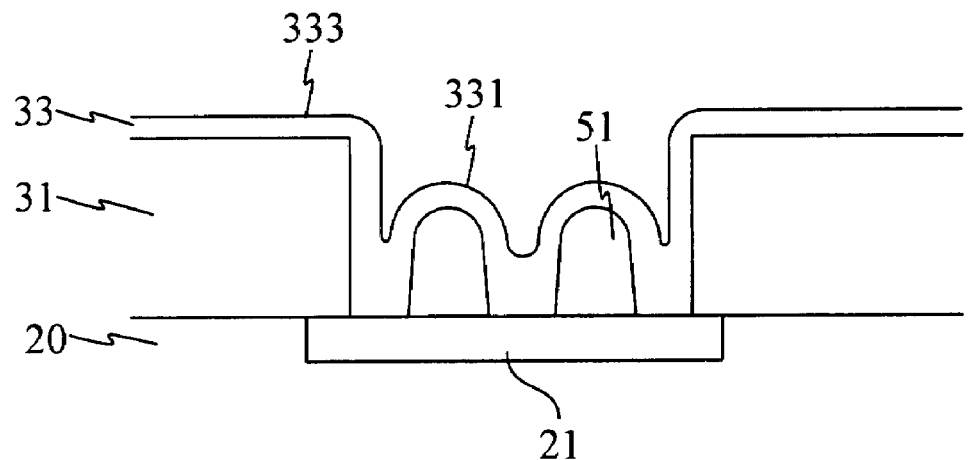
FIG. 3A is a schematic cross-sectional view showing a conductive layer formed in the packaging conductive structure of the present invention.
Figure 3B:
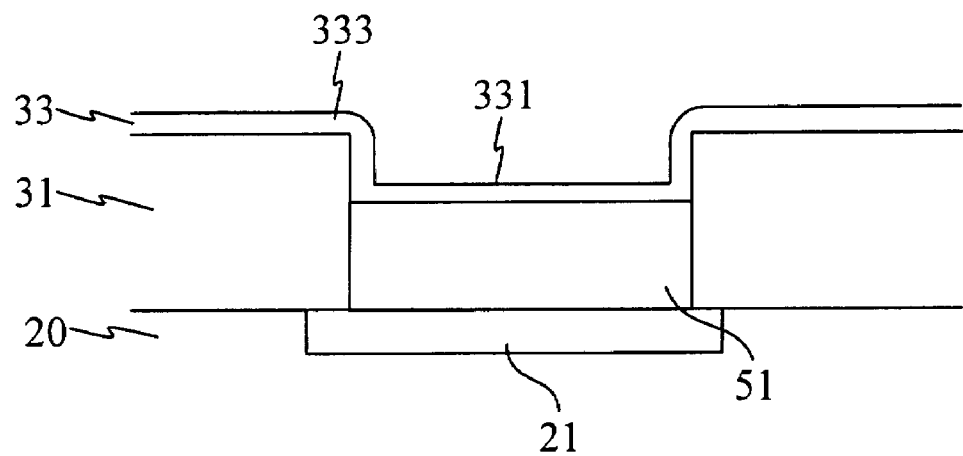
FIG. 3B is a schematic side view showing a lifting layer and a conductive layer formed in the packaging conductive structure of the present invention.

Next, an RDL may be formed. In reference to FIG. 3A (which is a cross-sectional view along the 3A-3A' line of FIG. 2C), a conductive layer 33 is formed on the above-mentioned structure to electrically connect to a portion of the metallic layer 21 which is not overlaid by the lifting layer 51. FIG. 3B illustrates a side view along the longitudinal direction of the lifting layer 51 (which is a cross-sectional view along the 3B-3B' line of FIG. 2C). The distance between the top of the lifting layer 51 and the edge of the dielectric layer 31 is shorter, and therefore, easier for the deposition of the conductive layer 33.

More specifically, the conductive layer 33 has a central portion 331 and a periphery portion 333. The central portion 331 of the conductive layer 33 is formed in the receiving space, which overlays the lifting layer 51 and is electrically connected to the exposed metallic layer 21. Furthermore, the periphery portion 333 at least partially overlays the edge of the dielectric layer 31.

Due to the arrangement of the lifting layer 51, the distance between the edge of the side wall of the dielectric layer 31 and the top of the lifting layer 51 is shorter than that between the edge of the side wall of the dielectric layer 31 and the metallic layer 21. The previous difficulty in depositing conductive layer 33 on the edge of the side wall of the dielectric layer 31 can then be effectively resolved. As a result, the conductive layer 33 is not at risk of breaking along the longitudinal direction of the lifting layer 51. The reliability of the packaging conductive structure is thereby ensured.

Figure 4:
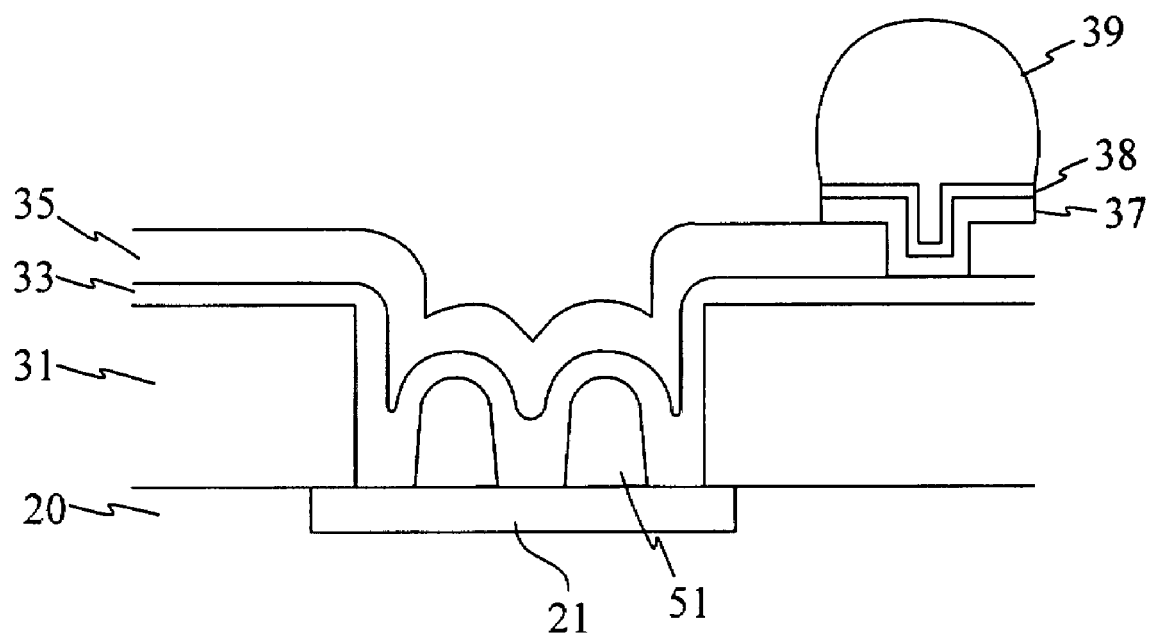
FIG. 4 is a schematic cross-sectional view showing the packaging conductive structure of the present invention.

As shown in FIG. 4, a passivation layer 35 that overlays the conductive layer 33 may be formed. A bump receiving space, which is located on a suitable position of the periphery portion of the conductive layer 33, is formed in the passivation layer 35 to expose a portion of the conductive layer 33. First, an under bump metal 37 is formed within the bump receiving space for electrically connecting to the conductive layer 33. The under bump metal 37 is usually made of a titanium/tungsten alloy, which may provide conductivity with better adhesion. Preferably, a bump conductive layer 38, which is made of gold for example, may be formed on the under bump metal 37 to enhance the conductivity thereof. Finally, a bump 39 is formed on the above-mentioned structure. The bump 39 is adapted to electrically connect to the conductive layer 33 through the under bump metal 37 and the bump conductive layer 38 within the bump receiving space.

Due to the arrangement of the under bump metal 37 and the bump conductive layer 38 between the bump 39 and the conductive layer 33, the bump 39 may be electrically connected to the conductive layer 33 (especially the central portion 331) and therefore connected to the metallic layer 21 of the semiconductor substrate 20 for better adhesion.

In light of the above descriptions, the packaging conductive structure 30 of the present invention uses the flexible arrangement of the lifting layer 51 to stably deposit a conductive layer 33 on the edge of the dielectric layer 31 for enhancing the reliability of the packaging conductive structure 30.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A packaging conductive structure for a semiconductor substrate which has a metallic layer, the packaging conductive structure comprising:
   - a dielectric layer, being formed on the semiconductor substrate and partially overlaying the metallic layer to define a receiving space;
   - a lifting layer formed within the receiving space, the lifting layer having two opposing sides each spaced apart from the dielectric layer, and two opposing ends each connecting with the dielectric layer; and
   - a conductive layer, having a central portion and a periphery portion, wherein the central portion is formed in the receiving space to electrically connect with the metallic layer, and the periphery portion at least partially overlays an edge of the dielectric layer.

2. The packaging conductive structure as claimed in claim 1, further comprising a bump at least electrically connecting with the central portion of the conductive layer.

3. The packaging conductive structure as claimed in claim 1, further comprising a bump and a passivation layer overlaying the periphery portion of the conductive layer, the passivation layer defining a bump receiving space, wherein the bump electrically connects with the conductive layer through the bump receiving space.

4. The packaging conductive structure as claimed in claim 3, further comprising an under bump metal being formed between the bump and the conductive layer.

5. The packaging conductive structure as claimed in claim 4, wherein the under bump metal is made of titanium/tungsten alloy.

6. The packaging conductive structure as claimed in claim 4, further comprising a bump conductive layer being formed between the bump and the under bump metal.

7. The packaging conductive structure as claimed in claim 6, wherein the bump conductive layer is made of gold.

8. The packaging conductive structure as claimed in claim 1, wherein the lifting layer is made of polyimide (PI) or oxide.

9. The packaging conductive structure as claimed in claim 1, wherein the metallic layer is made of aluminum.

10. The packaging conductive structure as claimed in claim 1, wherein the receiving space has a first longitudinal dimension and the lifting layer has a second longitudinal dimension which is at least half of the first longitudinal dimension.

11. The packaging conductive structure as claimed in claim 10, wherein the first longitudinal dimension and the second longitudinal dimension are substantially equal.

* * * * *